United States Patent
Tada et al.

(10) Patent No.: US 7,202,510 B2
(45) Date of Patent: Apr. 10, 2007

(54) SEMICONDUCTOR LUMINESCENT DEVICE AND MANUFACTURING METHOD THEREOF

(75) Inventors: Yoshiki Tada, Niiza (JP); Tetsuji Moku, Asaka (JP); Arei Niwa, Iruma-gun (JP); Yasuhiro Kamii, Iruma-gun (JP); Junji Sato, Saitama (JP); Takasi Kato, Asaka (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 0 days.

(21) Appl. No.: 11/249,644

(22) Filed: Oct. 13, 2005

(65) Prior Publication Data

US 2006/0081834 A1 Apr. 20, 2006

(30) Foreign Application Priority Data

Oct. 18, 2004 (JP) ............................. 2004-302665

(51) Int. Cl.
*H01L 29/24* (2006.01)
(52) U.S. Cl. ................... 257/102; 257/79; 257/E33.01
(58) Field of Classification Search ................. 257/79, 257/102; 438/22
See application file for complete search history.

(56) References Cited

U.S. PATENT DOCUMENTS 6,008,539 A * 12/1999 Shibata et al. .............. 257/745
6,992,331 B2 * 1/2006 Hon et al. ................... 257/79
7,071,490 B2 * 7/2006 Edmond et al. ............. 257/77
2004/0094772 A1 5/2004 Hon et al.

FOREIGN PATENT DOCUMENTS

JP 06-314822 8/1994

OTHER PUBLICATIONS

Office Action issued on Sep. 26, 2006, on the counterpart Taiwanese Patent Application No. 094135822. Total of 6 pages.

* cited by examiner

*Primary Examiner*—Minhloan Tran
*Assistant Examiner*—Eduardo A. Rodela
(74) *Attorney, Agent, or Firm*—Wood, Herron & Evans, L.L.P.

(57) ABSTRACT

A first principal plane faces a second principal plane of a p-type Ga N compound semiconductor that is in contact with an MQW luminescent layer. On the surface of the first principal plane, a first region made up of the p-type Ga N compound semiconductor including at least Ni is formed. On the surface of the first region, an electrode composed of an alloy including Ni and Aluminum is formed. On the electrode, a pad electrode for external connection consisting of Al or Au is formed.

4 Claims, 7 Drawing Sheets

FIG. 5A
14 — P-TYPE GaN COMPOUND SEMICONDUCTOR
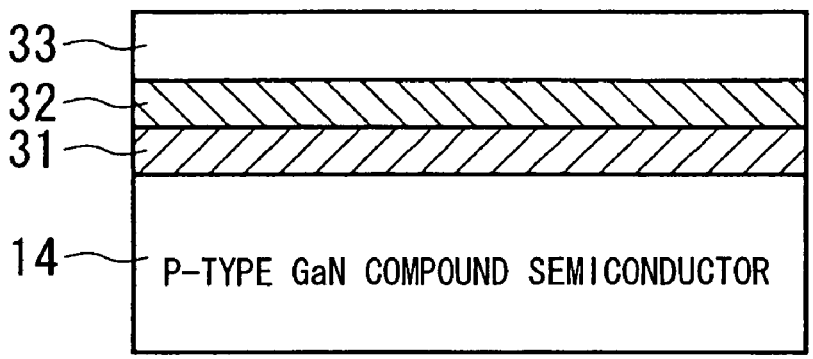
FIG. 5B
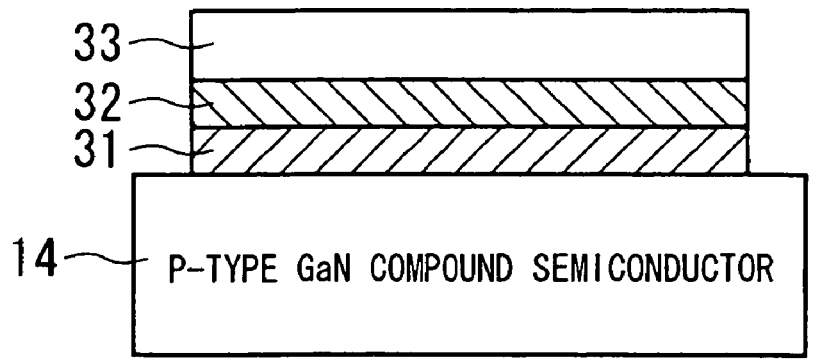
FIG. 5C

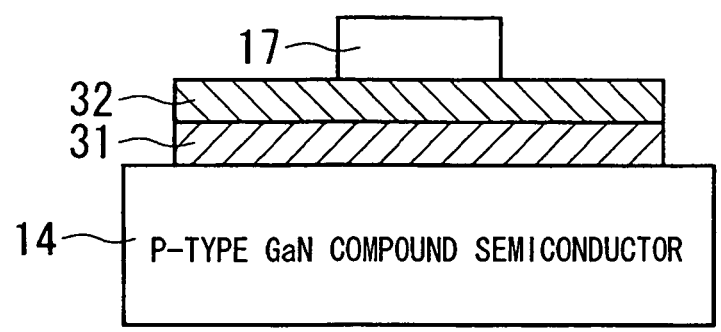
FIG. 6A
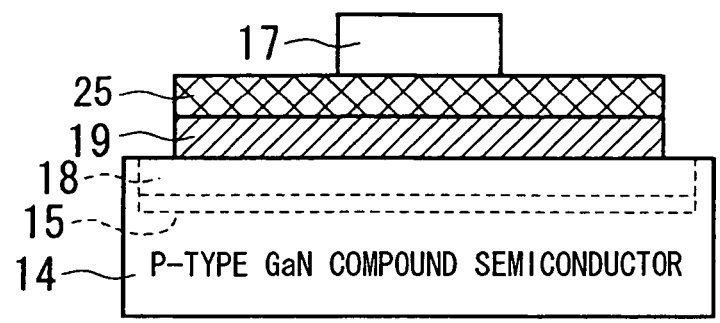
FIG. 6B
FIG. 7
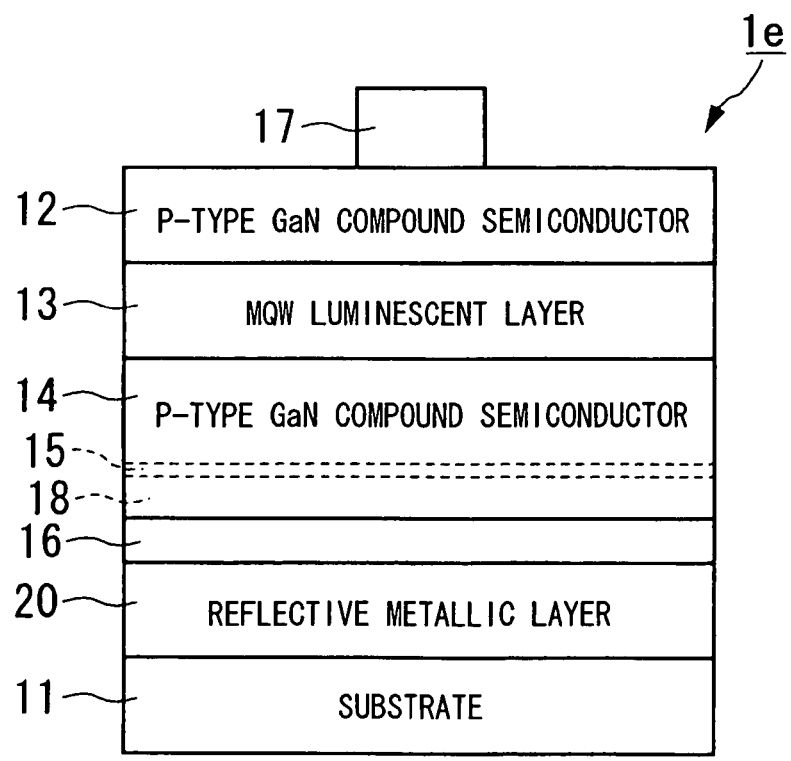

FIG. 8

| ELECTRODE | CONVENTIONAL ELECTRODE | (FOR COMPARISON) | 1 | 2 | 3 | 4 | 5 | 6 |
|---|---|---|---|---|---|---|---|---|
| | Ni/Au | SIMULTANEOUS EVAPORATION OF Ni AND Al (ALLOY) | Ni/Al | Ni/Al/Ni | Ni/Al/Ti | Ni/Au | Ni/Al | Ni/Al/Ni |
| MANUFACTURING METHOD | CONVENTIONAL (LIFT OFF) | CONVENTIONAL (LIFT OFF) | CONVENTIONAL (LIFT OFF) | CONVENTIONAL (LIFT OFF) | CONVENTIONAL (LIFT OFF) | MANUFCTURING METHOD OF THE INVENTION | MANUFCTURING METHOD OF THE INVENTION | MANUFCTURING METHOD OF THE INVENTION |
| FORWARD VOLTAGE [V] | 3.5 | 4.9 | 3.1 | 2.9 | 3.1 | 3.5 | 3.1 | 2.9 |
| LIGHT OUTPUT [mW] | 3.4 | 1.8 | 3.9 | 3.5 | 3.6 | 3.6 | 3.9 | 3.5 |
| PRESUMED HALF LIFE SPAN [TIME] | 10,000 | 10,000 | 30,000 | 90,000 | 90,000 | 20,000 | 30,000 | 90,000 |

SEMICONDUCTOR LUMINESCENT DEVICE AND MANUFACTURING METHOD THEREOF

PRIORITY CLAIM

Priority is claimed on Japanese Patent Application No. 2004-302665, filed Oct. 18, 2004, the content of which is incorporated herein by reference.

BACKGROUND OF THE INVENTION

1. Field of the Invention

The invention relates to a semiconductor luminescent device that includes a luminescent layer between a p-type GaN compound semiconductor material and an n-type GaN compound semiconductor material, and an electrode on the p-type GaN compound semiconductor material, and to a manufacturing method therefor. In particular, the invention relates to a semiconductor luminescent device that has relatively longer life expectancy and higher light output, and a manufacturing method therefor.

2. Description of Related Art

Recently, GaN compound semiconductor materials have been used in most cases as a semiconductor material for semiconductor luminescent devices. The GaN compound semiconductor materials are formed, by an MOCVD method or an MBE method, on a substrate made of Si, SiC, sapphire, oxide, or III-V family compound. When an insulating material such as sapphire as a substrate is used, an electrode cannot be obtained from a back side of the substrate, which is different from a luminescent device made of GaAs or AlGaInP using a conductive substrate. Accordingly, a pair of electrodes is formed on the same surface of a substrate.

Since a p-type GaN compound semiconductor material has a small mobility, current diffusion to a lateral direction is small. Because of this, when a voltage is applied to a semiconductor luminescent device, since a luminescent area is limited to an area directly below an electrode, current easily does not diffuse through an entire surface area of the semiconductor luminescent device. Therefore, an electrode used for this type of semiconductor luminescent device requires transparency and current diffusion to a lateral direction. Since an operating voltage for the semiconductor luminescent device should be small, a contact resistance between the GaN compound semiconductor and the electrode should be small.

The balance between the contact resistance for the transparent electrode and the GaN compound semiconductor material and the resistance (sheet resistance) of the transparent electrode itself should be well adjusted. Since current tends to flow through a low resistance, when the sheet resistance is extremely high compared with the contact resistance, the current does not reach the end of the transparent electrode from a pad for external connection provided on the transparent electrode, and instead flows midway to the GaN compound semiconductor. On account of this, the transparent electrode does not emit light through the entire surface. The current may flow through the luminescent layer in the vicinity of the pad provided on the transparent electrode, and when in an extreme case, only the luminescent layer immediately below the pad, with almost no emitting light.

Ni is well known as a metal that has a p-type GaN compound semiconductor material and ohmic resistance. However, Ni (resistivity 6.84 $\mu\Omega\cdot cm$) has a higher sheet resistance and a lower current diffusion in a lateral direction, compared with Au (resistivity 2.3 $\mu\Omega\cdot cm$) or Al (resistivity 2.6 $\mu\Omega\cdot cm$). Thickening film thickness of Ni decreases a sheet resistance of an electrode to be able to improve current diffusion in a lateral direction within the transparent electrode. However, light transmittance of the transparent electrode decreases, and so does light output of the semiconductor luminescent device.

It is well-known that in order to solve the problems mentioned above, a thin, metallic transparent electrode, which is formed almost all over the surfaces of the semiconductor luminescent device, is disposed as a p-type electrode, and then light is obtained through the transparent electrode. See, for example, Japanese Patent Publication Hei 6-314822. This patent document discloses that Au (the second layer) on Ni (the first layer), Ni (the second layer) on Cr (the first layer), and Ti (the second layer) on Pt (the first layer) are evaporated, by which a transparent electrode of two-layer structure is formed, heat processing is performed below the temperature at which the GaN compound semiconductor material does not resolve, and one portion of the electrode material is diffused inside the GaN compound semiconductor material or scattered outside, which makes the thickness of the transparent electrode 0.001~1 $\mu m$ to secure transparency.

An electrode of the prior art to be provided on the semiconductor luminescent device and a method of manufacturing pads will be described, referring to FIGS. 9A to 9D and FIGS. 10A to 10C. The processes for manufacturing an electrode and a pad are generally composed of at least two evaporation processes and one lift-off process. An electrode material and an anti-oxidization film material are evaporated on a p-type GaN compound semiconductor 21 processed beforehand (FIG. 9A) to form a transparent electrode 22 and an anti-oxidization film material 23 (FIG. 9B). Next, resist is coated on the anti-oxidization film material 23 to perform patterning the transparent electrode 22 and the anti-oxidization film material 23 (FIG. 9C).

Then, another resist is coated to form a resist film 24 (FIG. 9D) and make a window by removing a portion of the resist film 24 for forming a pad (FIG. 10A). A pad electrode 26 is formed by evaporating the pad electrode material (FIG. 10B), and is accomplished by stripping the resist film 24 using a lift-off method and performing patterning (FIG. 10C). The above explanation is made of a case in which the anti-oxidization film 23 is formed on the transparent electrode 22. However, the anti-oxidization film 23 may not be formed, which does not reduce the number of the total steps.

The patent document discloses a transparent electrode in which when performing heat process (anneal process), since surface strength of a second layer metal excels adhesion between a first layer metal and a second layer metal, a phenomenon called "ball-up" occurs through which the second metallic layer is condensed like a ball. When the phenomenon occurs, sheet resistance of the transparent electrode gets larger because continuity of the second layer (evaporation film) is damaged. This increases an operation voltage of the semiconductor luminescent device, and degrades current diffusion in a lateral direction, which lowers light output of the semiconductor luminescent device in an area away from the pad. There is a way to thickly form a second metallic layer in order to prevent the "ball-up" phenomenon. When the metal is made thicker, the transmittance of light as a transparent electrode gets lower to reduce the transparency of the electrode.

Al or alloy containing Al or oxide on the surface of a p-type GaN compound semiconductor tends to form a p-type GaN compound semiconductor and a Schottky barrier, which makes direct mounting difficult. Since Ni has a work function of about 5.1 eV, a large value, it is quite often used as an electrode material for forming an ohmic junction with a p-type semiconductor. On the other hand, Al is used as an electrode material for forming an ohmic junction with an n-type semiconductor. However, because Al has a relatively small work function of about 4.1 eV, it readily tends to form a Schottky barrier with a p-type semiconductor.

Since the process for manufacturing an electrode according to the prior art experiences many complicated steps, it has the tendency to have a low yield rate. In addition, because the resist films are stripped off by a lift-off method, one portion of the stripped resist film is apt to remain on the transparent electrode as a foreign object after performing lift-off. On account of this, the foreign object left on the transparent electrode interrupts light from the luminescent layer, which produces a problem that light output from the semiconductor luminescent device gets lower. Moreover, when a LED lamp or a chip LED is made by resin molding, the foreign object damages the adhesion between the lamp resin and the semiconductor luminescent device (chip), and moisture crept in from outside enters the resin, which accelerates deterioration of the chip or electrode and makes the semiconductor luminescent device less reliable. Accordingly, there is a need to solve the problems mentioned above.

SUMMARY OF THE INVENTION

The invention is directed to a semiconductor luminescent device for improving some characteristics of an electrode that is in contact with a p-type GaN compound semiconductor and to a manufacturing method therefore. Furthermore, the invention is also directed to a method of manufacturing a semiconductor luminescent device that can prevent a foreign object from being produced and improve light output of the semiconductor luminescent device as well as enhance reliability of the completed semiconductor luminescent device.

The invention is directed to a semiconductor luminescent device and a method of manufacturing a semiconductor luminescent device that satisfy the need.

The first aspect of the invention relates to a semiconductor luminescent device that comprises a p-type GaN compound semiconductor having two opposing principal planes; an n-type GaN compound semiconductor; a luminescent layer formed between one principal plane of the p-type GaN compound semiconductor and the n-type GaN compound semiconductor; a first region formed on a surface of the other principal plane of the p-type GaN compound semiconductor and composed of the p-type GaN compound semiconductor containing Ni; and an electrode formed on the first region and having transparency of alloy containing Al.

The second aspect of the invention relates to a semiconductor luminescent device that comprises a p-type GaN compound semiconductor having two opposing principal planes; an n-type GaN compound semiconductor; a luminescent layer formed between one principal plane of the p-type GaN compound semiconductor and the n-type GaN compound semiconductor; a first region formed on a surface of the other principal plane of the p-type GaN compound semiconductor and composed of the p-type GaN compound semiconductor containing Ni; and a second region formed on the first region and composed of the p-type GaN compound semiconductor containing Ni and Al; and an electrode formed on the second region and having transparency of alloy containing Al.

Preferably, the Al has a density thereof which becomes higher in a direction from the surface of the electrode to the p-type GaN compound semiconductor.

Preferably, the density of the Al constituting the electrode is between 25% and 75% on a contact plane made up of the p-type GaN compound semiconductor and the electrode, and wherein the density of the Al constituting the electrode is between 5% and 25% on the surface of the electrode opposing the contact plane.

Preferably, the electrode includes a first alloy layer made up of an alloy of Ni and Al; and a second alloy layer formed on a surface of the first alloy layer and made up of a metal containing any one of Ni, Ti, Cu, Cr, and Zn, or an oxide of the metal, or an alloy of the metal and Al.

The third aspect of the invention relates to a method of manufacturing a semiconductor luminescent device having a p-type GaN compound semiconductor having two opposing principal planes; an n-type GaN compound semiconductor; and a luminescent layer formed between one principal plane of the p-type GaN compound semiconductor and the n-type GaN compound semiconductor. The method comprises forming an electrode layer made up of a plurality of layers by laminating a plurality of electrode materials including Al on the other principal plane of the p-type GaN compound semiconductor; etching the electrode layer via a wet etching, by using a difference in etching speeds regarding the same drug solution and making a layer lower than a layer to be etched function as an etching stopping layer; and forming an alloy layer between the p-type GaN compound semiconductor and the electrode layer by administering heating process.

BRIEF DESCRIPTION OF THE DRAWINGS

FIG. 5A is one of a series of process drawings showing a manufacturing method of a luminescent device in accordance with a second embodiment of the invention.

FIG. 5B is one of a series of process drawings showing a manufacturing method of a luminescent device in accordance with a second embodiment of the invention.

FIG. 5C is one of a series of process drawings showing a manufacturing method of a luminescent in accordance with a second embodiment of the invention.

FIG. 6A is one of a series of process drawings showing a manufacturing method of a luminescent device in accordance with a second embodiment of the invention.

FIG. 6B is one of a series of process drawings showing a manufacturing method of a luminescent device in accordance with a second embodiment of the invention.

FIG. 7 is a cross-sectional view showing a cross-sectional structure for a luminescent device in accordance with a third embodiment of the invention.

FIG. 8 shows several characteristic of luminescent device produced by a manufacturing method of the invention and that of the prior art.

DETAILED DESCRIPTION OF THE INVENTION

Figure 1:
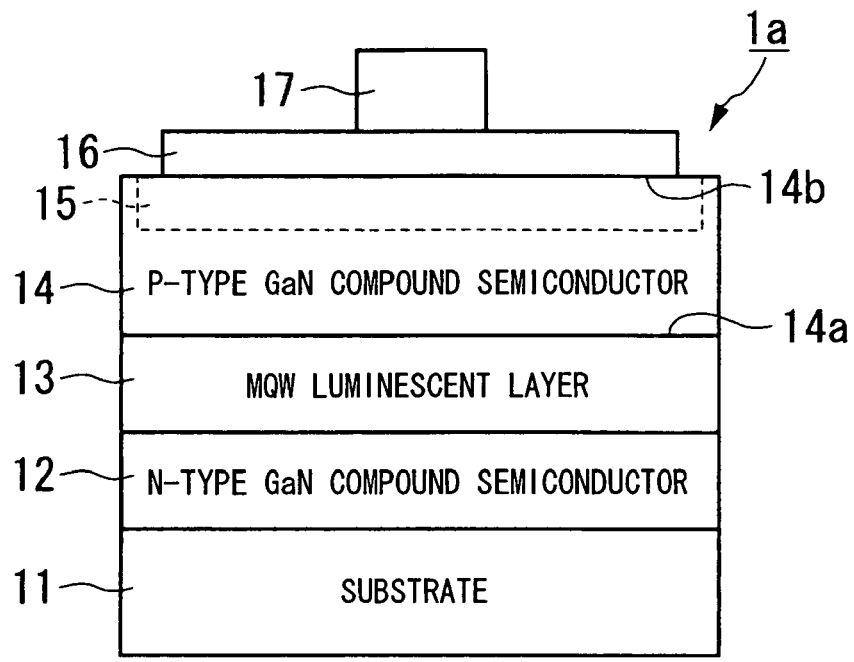
FIG. 1 is a cross-sectional view showing a cross-sectional structure for a luminescent device in accordance with a first embodiment of the invention.

The embodiments in accordance with the invention will be described referring to the figures. FIG. 1 shows a cross-sectional structure of a luminescent device (a semiconductor luminescent device) 1a in accordance with a first embodiment of the invention. In the luminescent device in accordance with the embodiment, an n-type clad layer, which is composed of GaN compound semiconductor on a substrate 11 formed by sapphire, silicon carbide, or silicon, an active layer, and a p-type clad layer are laminated. The luminescent device is formed by dicing or cleaving the layers. The active layer of the luminescent device has a Multi-Quantum-Well (MQW) or a Single-Quantum-Well (SQW) structure. The active layer in the embodiments below, including the present embodiment, is expressed by the MQW, but the MQW includes the SQW.

In FIG. 1, an n-type GaN compound semiconductor 12, an MQW luminescent layer 13, and a p-type GaN compound semiconductor 14 are laminated on the substrate 11 in that order, respectively. The MQW luminescent layer 13 is formed by InGa or GaN, and in order to make the luminescent element 1a highly efficient, is formed by laminating many thin films of several nm-several 10 nm. So as to obtain high efficiency, excellent optical crystallinity and crystallinity should be obtained. A Metal Organic Chemical Vapor Deposition (MOCVD) method is used to produce the MQW luminescent layer 13. Gas flow in a reaction tube of an MOCVD apparatus is controlled so that an abrupt heterointerface on an atomic level is required to be obtained.

On the surface of a principal plane 14b opposing a principal plane 14a of the p-type GaN compound semiconductor that is in contact with the MQW luminescent layer 13, a first region 15 is formed that is composed of the p-type GaN compound semiconductor containing at least Ni. On the surface of the first region 15, an electrode 16 is formed that is formed by an alloy of Ni and Al. The electrode 16 constitutes a transparent electrode. On the electrode 16, a pad electrode 17 for external connection including Al or Au is formed.

Figure 2:
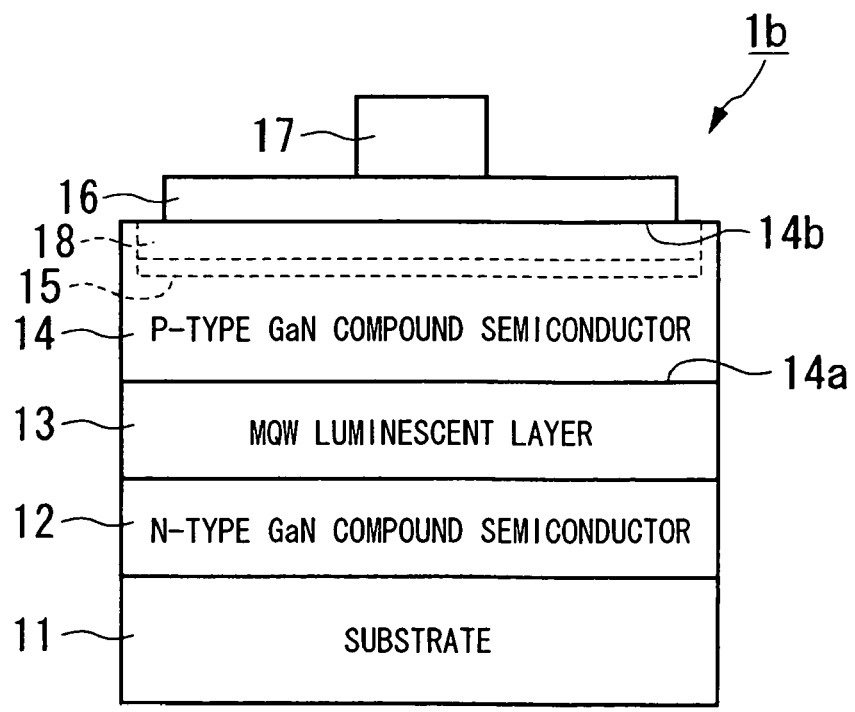
FIG. 2 is a cross-sectional view showing a cross-sectional structure for a luminescent device in accordance with a variant of the first embodiment of the invention.

FIG. 2 shows a cross-sectional structure of a luminescent device 1b in accordance with a variant of the present embodiment. In the luminescent device 1b, on the surface of the first region 15, a second region 18 is formed that is composed of the p-type GaN compound semiconductor material including Ni and Al. That is, the second region 18 is sandwiched by the first region 15 and the electrode 16. When Ni and Al are laminated by evaporation on the principal plane 14b of the p-type GaN compound semiconductor 14 and are annealed under certain conditions, the electrode 16 is produced between the first region 15 and the second region 18.

The electrode 16 in accordance with the embodiment refers to a layer composed of a mixture. The mixture is meant by a mixture of constituent elements that are not alloyed, and an alloy that consists of at least two elements of constituent elements. The electrode 16 may contain either oxide of Ni and Al. The oxide refers to a mixture that contains an oxide, and may contain a metal that is not oxidized. Moreover, the oxide may contain a mixture whose oxidation number is different (for example, consisting of an oxide having less oxygen number). For reference, the first region 15 is a region of mixture that contains at least Ni and a p-type GaN compound semiconductor; the second region 18 is a region of mixture that contains at least Ni, Al and a p-type GaN compound semiconductor.

The melting point of Al 660° C. is lower compared with that of Au (1063° C.). It is generally said that metal causes self surface diffusion at about 1/10 of the melting point, and that alloy begins at about 1/3 of the melting point. Accordingly, the electrode 16 is formed by anneal processing or radiation heat at evaporation. The alloying increases adhesion to condense metal for forming the electrode 16 at the time of heat treatment, which prevents the ball-up phenomenon from occurring. Accordingly, the continuity of evaporation films is improved, and the sheet resistance is becomes lower. Thus, this can control an operation voltage of the luminescent device. Al included in the electrode 16 has a low sheet resistance, which can improve current diffusion in a lateral direction within the electrode 16 to enhance light output.

When the first region 15 and the electrode 16 are formed, the electrode manufactured by heat treatment after Al is evaporated on Ni has good results in various characteristics than the electrode formed by evaporating Ni and Al simultaneously.

FIG. 8 shows differences in the characteristics of the luminescent devices when they are manufactured in different ways. The data shown in FIG. 8 is one example to compare various characteristics derived from the different structures of transparent electrodes, and is not guaranteed with respect to the values. The data for the electrode structure in accordance with the embodiments described later is shown in FIG. 8.

Ni contained in the first region 15 is known as an electrode material that constitutes ohmic contact with the p-type semiconductor. Ni has a catalytic effect of accelerating description of hydrogen that makes acceptors inactive. Ni also has a property to occlude hydrogen. The first region 15, which is formed by forming and annealing Ni on the p-type GaN compound semiconductor 14, produces a lower resistance between the p-type GaN compound semiconductor 14 and the electrode 16, according to the property. Through the first region 15, the p-type GaN compound semiconductor 14 and the electrode 16 can form a low contact resistance. Moreover, strong adhesion between the p-type GaN compound semiconductor 14 and the electrode 16 can be secured.

Furthermore, since a melting point for Al is low, Al tends to penetrate into the the p-type GaN compound semiconductor 14. Because Al has a relatively low work function, it constitutes Schottky junction with regard to the p-type GaN compound semiconductor 14. The first region 15, which is built below the second region 18, (like a barrier) plays a role of preventing Al from penetrating into the p-type GaN compound semiconductor 14, and has an ohmic junction with the p-type GaN compound semiconductor 14.

The second region 18 includes the p-type GaN compound semiconductor having Ni and Al and is formed between the electrode 16 and the first region 15. It is ascertained that the second region 18 accelerates the effect of diffusing current all over the electrode 16, and has the effect of making uniform a luminescent distribution of the semiconductor luminescent device. The principle is unknown, but it is considered that the second region 18 has good current diffusion because it contains Ni and Al, and at the same time has the effect of reducing contact resistance between the p-type GaN compound semiconductor material 14 and the first region 15 having a low contact resistance, and contact resistance with respect to the electrode 16 having good current diffusion.

It is preferable that in the transparent electrode (electrode 16), the density of Al (the number of Al atoms in the number of the atoms of all the constituent elements per unit volume) of the constituent elements for the transparent electrode material is increased in a direction from the surface of the transparent electrode, on which side the pad electrode 17 is provided, to the p-type GaN compound semiconductor material 14. Ni and Al are laminated in the order on the principal plane of the p-type GaN compound semiconductor material 14. When annealing is performed, at least the first region 15 and the electrode 16 are formed, when Al is melted to penetrate Ni below and constitute the Al density described above. In order to vary the distribution of the Al density, the temperature at annealing and time thereof may be changed.

It is preferable that the Al density of the electrode 16 is between 25% and 75%, of the constituent elements of the transparent electrode material on the surface of the transparent electrode (electrode 16) opposing the semiconductor, and it is more preferable that the density is between 30% and 60%. Al has a melting temperature of 660° C., which is relatively low compared with Ni and Au. Considering that the temperature at annealing for producing alloy is between 300° C. and 650° C. owing to the influence of the heat of semiconductor layers, and that alloying begins at about ⅓ temperature of the melting point (in the case of Al, approximately 220° C.), Al is easier to be alloyed than other metals such as Au. The alloying of Al and the metal laminated below the Al goes deeper than the interface between the Al and the metal. However, when the ratio of Al to the constituent elements is over 75%, it is difficult for the transparent electrode and the p-type GaN compound semiconductor to secure the ohimic property.

It is preferable that at the transparent electrode (electrode 16), the density of Al in the constituent elements of the transparent electrode material on the surface of the transparent electrode, which faces the contact plane of the first region 15 (or the second region 18), on the side where the pad electrode 17 is provided, is between 5% and 25%. When the density is below 5%, since the ratio of the metal laminated on the lower plane becomes higher, a sheet resistance of the transparent electrode becomes larger. Accordingly, the balance between the contact resistance of the transparent electrode and the GaN compound semiconductor 14 and the sheet resistance of the transparent electrode gets worse, which lowers light output and shortens half life expectancy.

By contrast, when Al has a high ratio in the constituent elements on the surface of the transparent electrode, more portions of Al touch the open air, and the ratio of oxide containing Al as a constituent element gets higher. Because the oxide containing Al as a constituent element has a high transparency, but is an insulator, current diffusion in a lateral direction is interrupted, and a forward voltage rises. In addition, current is concentrated directly below the pad electrode 17 to reduce life span of the luminescent device.

As will be described later, in order to have the surface of the transparent electrode function as an etching top layer at the time of etching the pad electrode 17, it is desirable that the ratio of Al in the constituent elements be less than 25%. When Al has a high ratio in the constituent elements, since Al is etched in spite of a slow etching speed at the time of forming the pad electrode 17, the surface of the transparent electrode has a weak function as an etching top layer.

It is desirable that the thickness of the formed transparent electrode (electrode 16) be 1~20 nm so as to secure transparency thereof. Furthermore, it is more desirable that the thickness of the transparent electrode be 1~5 nm.

Next, a method of manufacturing a transparent electrode and a pad electrode will be described that are included by a luminescent device 1a in accordance with the embodiment. Metals Ni (3 nm) and Al (5 nm) constituting the transparent electrode and Au (400 nm) constituting the pad electrode 17 are evaporated by one step on a p-type GaN compound semiconductor 14 (metal evaporation step). Following the step, photoresist is coated and exposed on a surface of Au to form a resist mask in a shape of a transparent electrode. Next, Au is wet etched by, for example, potassium cyanide (KCN), and Al and Ni are etched by hydrochloric acid (HCl). Finally, the resist mask is removed by acetone (transparent electrode forming step).

Photoresist is coated and exposed on the surface to form a resist mask in a shape of an electrode. Then, Au constituting the pad electrode is wet etched by, for example, potassium iodide (KI) etchant to form the pad electrode 17. Because Al is etched in slower etching rate, compared with Au, by potassium iodide (KI) etchant, the etching can be interrupted on the surface of exposed Al. That is, Al becomes an etching stopping layer (a pad electrode forming step). In this way, making use of the difference in etching speeds for the same drug solution, the lower layer (Al) of the etching layer (Au) is operated as an etching stopping layer. The pad electrode 17 can be formed by etching the etching layer by wet etching. Finally, when heating process is performed under the conditions of predetermined temperature and time, the first region and the electrode are formed (anneal step).

As described above, the first region 15 in accordance with the embodiment is in contact with the p-type GaN compound semiconductor 14, with a low resistance and a high adhesion. In addition, because the electrode 16 contains Al, by alloying according to radiation heat at evaporation as described above, adhesion and continuity for the first region 15 and the electrode 16 can be improved to reduce generation of the ball-up phenomenon and sheet resistance of the electrode 16.

The second embodiment of the invention will be described.

Figure 3:
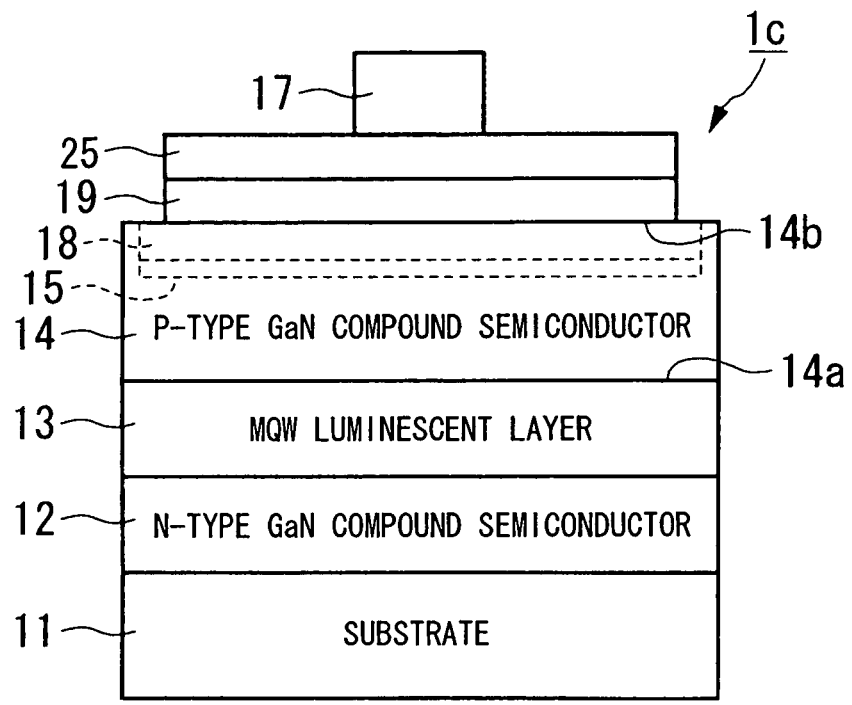
FIG. 3 is a cross-sectional view showing a cross-sectional structure for a luminescent device in accordance with a second embodiment of the invention.

FIG. 3 shows a cross-sectional structure of a luminescent device 1c in accordance with the embodiment of the invention. In the embodiment, a transparent electrode is made up of a first alloy layer 19 and a second alloy layer 25. It is desirable that the first alloy layer 19 should be composed of alloy consisting of Ni and Al, while the second alloy layer 25 should be a material that has relatively high adhesion with the first alloy layer 19 and that controls supply of oxygen in order to prevent deterioration caused by natural oxidation of the Al material contained in the first alloy layer 19. On account of this, it is desirable that a stable material that is difficult to be oxidized should be used or that a material that is easily oxidized to form a stable oxide and difficult to undergo a change caused by time passage (a material that does not supply oxygen outside) should be used.

It is desirable that as a material appropriate for the second metal 25, any one of Ni, Ti, Cu, Cr, and Zn, or an oxide or alloy of any one of them Ni should be used. Moreover, considering the ohmic property of the first alloy layer 19, it is desirable that Ni, an electrode material which contains the same element as the first alloy layer 19, should be contained. Preferably, the first alloy layer 19 plays a role of preventing natural oxidation of the surface thereof, and simultaneously functioning as an etching stopping layer for preventing Al contained in the first alloy layer 19 from being etched when manufacturing the pad, in the manufacturing step of the transparent electrode and the pad electrode 17 to be described later.

From the above, preferably, the second alloy layer 25 should contain an oxide. The transparent electrode formed as the second alloy layer 25 includes an alloy layer consisting of an electrode material constituting the second alloy layer 25 and Al constituting the second alloy layer 25. However, in order to prevent oxidization, it is desirable that the ratio of Al contained in the second alloy layer 25 should be less than that of Al contained in the first alloy layer 19.

Based on the same reasons as in the case of the first embodiment, in the transparent electrode (the first alloy layer 19 and the second alloy layer 25), preferably, the density of Al (the number of Al atoms in the number of the atoms for all the structural elements per unit volume) of the structural elements for the transparent electrode material should be increased in a direction from the electrode surface on the side where the pad electrode 17 is provided to the plane tangent to the p-type GaN compound semiconductor 14. Of the structural elements of the transparent electrode material on the surface of transparent electrode that faces the p-type GaN compound semiconductor 14, the ratio of Al of all of the transparent electrode material (the ratio of atomic number) should be between 25% and 75%. It is more desirable that the ratio should be between 30% and 60%. More over, in the transparent electrode, the density of Al should be between 5% and 25% of the structural elements for the transparent electrode material on the transparent electrode surface to which the pad electrode 17 is provided.

In the luminescent device 1c in accordance with the embodiment, as with the luminescent device 1a in accordance with the first embodiment, the second region 18 is formed between the first region 15 and the first alloy layer 19. However, the second region 18 may not be formed. On a plane opposite to the plane tangent to the first alloy layer 19 of the second alloy layer 25, the thickness of the transparent electrode can be made thinner in a direction of an end of the transparent electrode, by gradually etching the surface of the second alloy layer 25 not tangent to the pad electrode 17. The second alloy layer 25 may be formed only in a region directly below the pad electrode tangent to the pad electrode 17 (a luminescent device 1d in FIG. 4). Making the transparent electrode thinner increases a resistance on an end of the transparent electrode and lowers current diffusion in a lateral direction of the transparent electrode; however it enhances transparency and light output outside.

Where the ratio of Al of the structural elements on the surface of the first alloy layer 19 is low and the density of Ni as a structural element is high, when the second alloy layer 25 is etched in a step of manufacturing an electrode structure to be described later, the function as an etching stopping layer by the first alloy layer 19 weakens. Therefore, it is preferable that the ratio of Al of the structural elements on the surface of the first alloy layer 19 should be over 5%.

A method of manufacturing an electrode structure the luminescent device 1c in accordance with the embodiment possesses will be described, referring to FIG. 5A to FIG. 5C. First, a p-type GaN compound semiconductor 14 is prepared (FIG. 5A). On the p-type GaN compound semiconductor 14, Ni (3 nm) constituting a transparent electrode, Al (5 nm), Ni (2 nm) and Au (400 nm) constituting a pad electrode 17 are evaporated in one step to form metallic layers 31~33 (FIG. 5B for metal evaporating step). The metallic layer 31 consists of Ni and Al or a mixture produced at the time of having evaporated them; the metallic layer 32 Ni; and the metallic layer 33 Au.

Then, photoresist is applied to the surface of the metallic layer 33, which is exposed to form resist mask in a electrode shape. The metallic layer 33 is wet etched by an etchant such as potassium iodide (KI), and then the metallic layers 31 and 32 are etched by hydrochloric acid (HCl). Finally, the resist mask is removed by acetone (FIG. 5C for an electrode forming step).

Next, photoresist is applied to the surface, which is exposed to from a resist mask for a pad electrode shape. The metallic layer 33 constituting the pad electrode is wet etched by, for example, a potassium iodide (KI) etchant, to form the pad electrode 17. Since the surface of the metallic layer 32 is not allowed to be etched by a potassium iodide (KI) etchant, the etching is interrupted when the surface of the metallic layer 32 appears. That is, the metallic layer 32 becomes a etching stopping layer (FIG. 6A for a pad electrode forming step). Finally, when heating process is applied under the conditions of predetermined temperature and time, the first region 15, the second region 18, and the second alloy layer 25 are formed (FIG. 6B for a anneal step).

Figure 4:
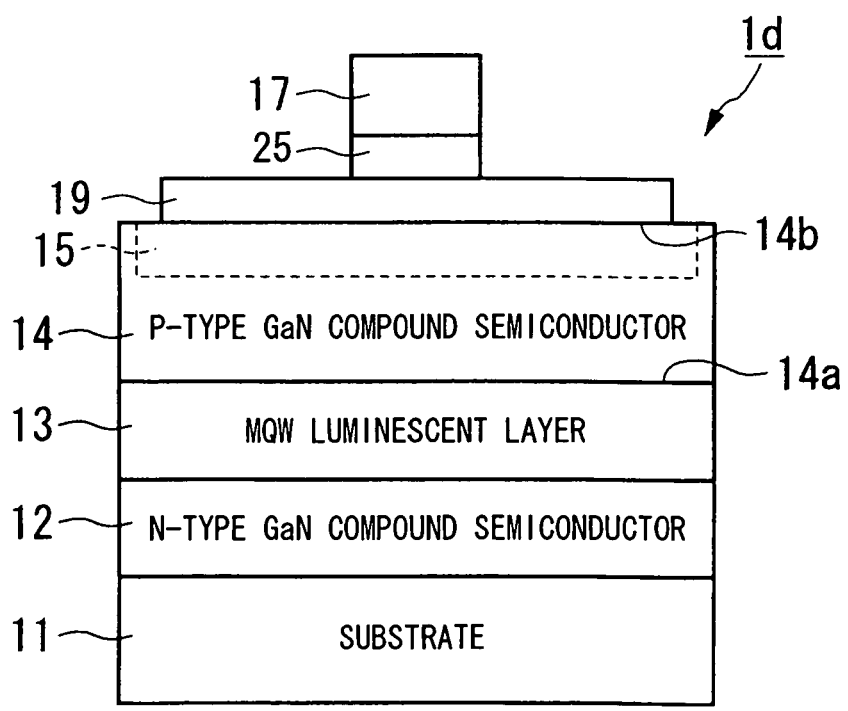
FIG. 4 is a cross-sectional view showing a cross-sectional structure for a luminescent device in accordance with a variant of the second embodiment of the invention.
Figure 9A:
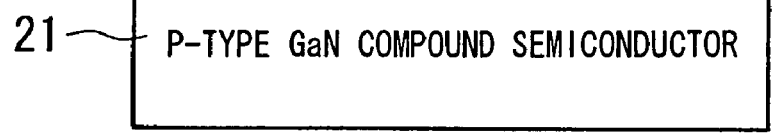
FIG. 9A is one of a series of process drawings showing a manufacturing method of a luminescent device in accordance with the prior art.
Figure 9B:
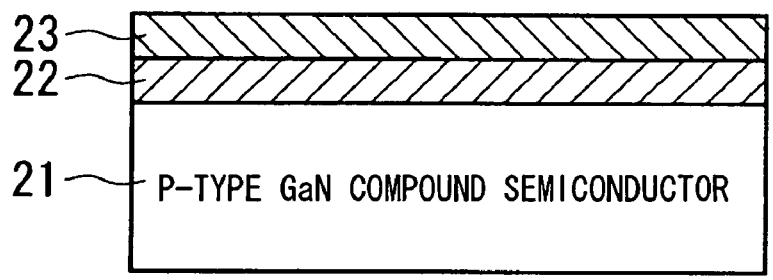
FIG. 9B is one of a series of process drawings showing a manufacturing method of a luminescent device in accordance with the prior art.
Figure 9C:
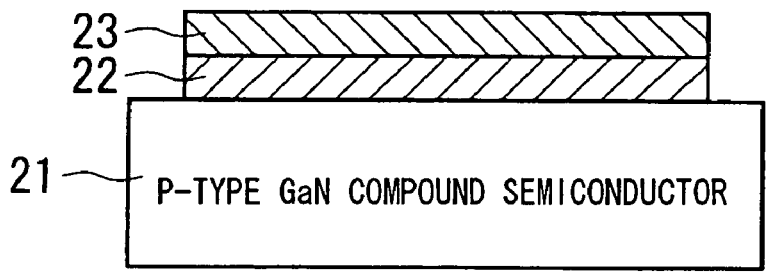
FIG. 9C is one of a series of process drawings showing a manufacturing method of a luminescent device in accordance with the prior art.
Figure 9D:
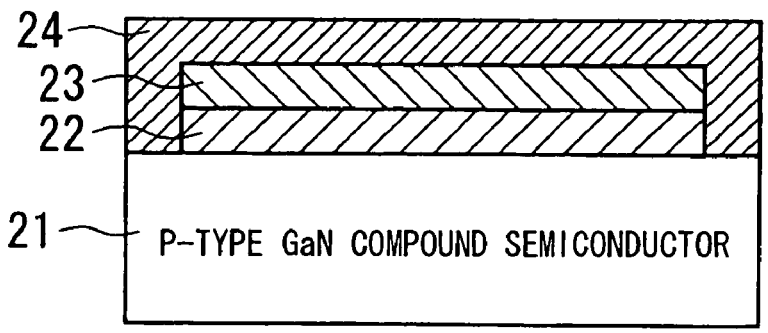
FIG. 9D is one of a series of process drawings showing a manufacturing method of a luminescent device in accordance with the prior art.
Figure 10A:
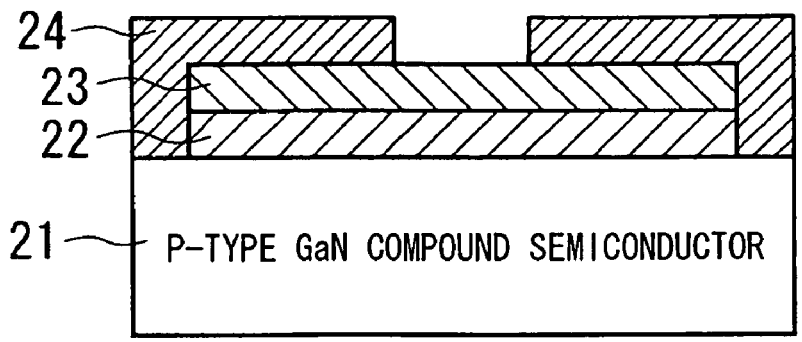
FIG. 10A is one of a series of process drawings showing a manufacturing method of a luminescent device in accordance with the prior art.
Figure 10B:
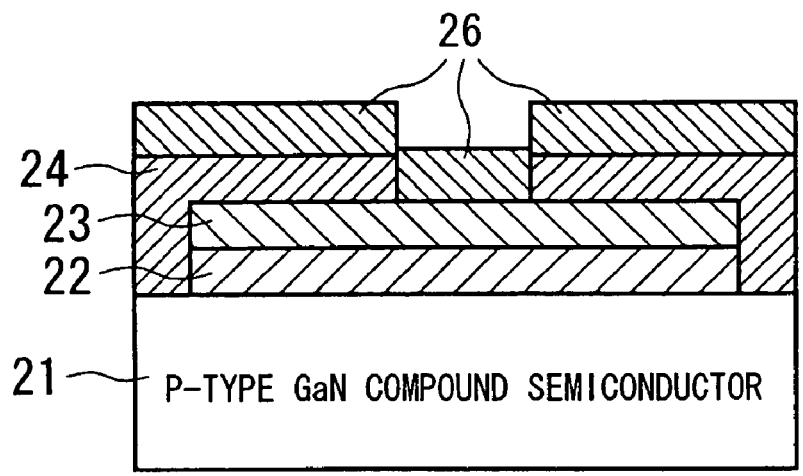
FIG. 10B is one of a series of process drawings showing a manufacturing method of a luminescent device in accordance with the prior art.
Figure 10C:
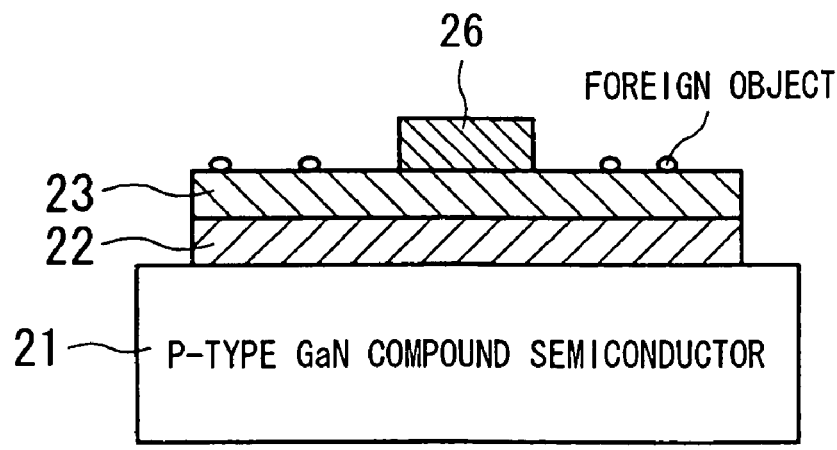
FIG. 10C is one of a series of process drawings showing a manufacturing method of a luminescent device in accordance with the prior art.

When the electrode structure for the luminescent device 1d shown in FIG. 4 is manufactured, the metallic layer 32 having a limited area is etched in FIG. 6A by, for example, nitric acid ($HNO_3$). Since the metallic layer 31 may not be etched by nitric acid ($HNO_3$), the etching is interrupted when the metallic layer 31 is reached. After this, the resist mask is removed by acetone, and when heating process is conducted under the conditions of predetermined temperature and time, the first region 15, the second region 18, and the second alloy layer 25 are formed.

In the manufacturing method described above, the structural elements for the transparent electrode and the pad electrode 17 are not limited to the above examples. Materials, which have the difference between an etching speed for a metallic layer to be etched and that for a lower layer below the metallic layer, are appropriate for an etching material used as the electrode or pad.

Since the manufacturing method in accordance with the embodiments, which is different from that of the prior art, does not include an electrode forming step by a lift-off method, a foreign object can be prevented from remaining on the transparent electrode when the resist is removed. Accordingly, interrupting light from the luminescent device by a foreign object on the transparent electrode may be prevented, which can enhance light out.

Moreover, since the adhesion between the lamp resin and the chip increases, moisture from the outside is prevented from creeping into the lamp resin, which can improve life span of the semiconductor luminescent device. Because the laminating for forming the electrode and pad is made one evaporation step, the number of steps can be decreased and productivity can be improved.

A third embodiment of the invention will be described. FIG. 7 show a cross-sectional structure of a luminescent device 1e in accordance with the embodiment. In the luminescent device 1e, a reflective metallic layer 20, which contains metal such as Al, Rh, and Ag, is formed on the substrate 11. On the reflective metallic layer 20, the structures described in the first and second embodiments are formed. This luminescent device 1e is applicable to a power LED.

Because the first region composed of the p-type GaN compound semiconductor containing at least Ni is formed between the electrode containing Al and the p-type GaN compound semiconductor, the invention improves some characteristics of the semiconductor luminescent device such as adhesion and continuity between the first region and the electrode and low contact resistance between the first region and the p-type GaN compound semiconductor. Since a layer below the layer for etching functions as a stop layer, and the wet etching is employed for forming the electrode and pad, the foreign object, which is produced when removing the resist according to the prior art, is prevented from being generated, which reduces light interruption by the foreign object. Because the adhesion between the lamp resin and the chip is increased, the light output of the electrode is improved, and at the same time, the reliability of the completed semiconductor luminescent device is enhanced.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor luminescent device comprising:
   a p-type GaN compound semiconductor having two opposing principal planes;
   an n-type GaN compound semiconductor;
   a luminescent layer formed between one principal plane of the p-type GaN compound semiconductor and the n-type GaN compound semiconductor;
   a first region formed inside of the p-type GaN compound semiconductor at a surface region of the other principal plane of the p-type GaN compound semiconductor and composed of the p-type GaN compound semiconductor containing only Ni; and
   a second region formed inside of the p-type GaN compound semiconductor and closer to the other principal plane than the first region at the surface of the other principal plane, and composed of the p-type GaN compound semiconductor containing Ni and Al; and
   an electrode formed on the second region and having transparency of alloy containing Al.

2. A semiconductor luminescent device comprising:
   a p-type GaN compound semiconductor having two opposing principal planes;
   an n-type GaN compound semiconductor;
   a luminescent layer formed between one principal plane of the p-type GaN compound semiconductor and the n-type GaN compound semiconductor:
   a first region formed inside of the p-type GaN compound semiconductor at a surface region of the other principal plane of the p-type GaN compound semiconductor and composed of the p-type GaN compound semiconductor containing Ni: and
   an electrode formed on the region and having transparency of alloy containing Al, wherein the Al has a density thereof which becomes higher in a direction from the surface of the electrode to the p-type GaN compound semiconductor.

3. A semiconductor luminescent device as recited in claim 2, wherein the density of the Al constituting the electrode is between 25% and 75% on a contact plane made up of the p-type GaN compound semiconductor and the electrode, and wherein the density of the Al constituting the electrode is between 5% and 25% on the surface of the electrode opposing the contact plane.

4. A semiconductor luminescent device comprising:
   a p-type GaN compound semiconductor having two opposing principal planes:
   an n-type GaN compound semiconductor;
   a luminescent layer formed between one principal plane of the p-type GaN compound semiconductor and the n-type GaN compound semiconductor;
   a first region formed inside of the p-type GaN compound semiconductor at a surface region of the other principal plane of the p-type GaN compound semiconductor and composed of the p-type GaN compound semiconductor containing Ni; and
   an electrode formed on the first region and having transparency of alloy containing Al, wherein the electrode includes:
      a first alloy layer made up of an alloy of Ni and Al; and
      a second alloy layer formed on a surface of the first alloy layer and made up of a metal containing any one of Cu, Cr, and Zn, or an oxide of the metal, or an alloy of the metal and Al.

* * * * *